US011515172B2

(12) United States Patent
Takahashi (10) Patent No.: US 11,515,172 B2
(45) Date of Patent: *Nov. 29, 2022

(54) METHOD OF ETCHING OBJECT (71) Applicant: FLOSFIA INC., Kyoto (JP)

(72) Inventor: Isao Takahashi, Kyoto (JP)

(73) Assignee: FLOSFIA INC., Kyoto (JP)

( * ) Notice: Subject to any disclaimer, the term of this patent is extended or adjusted under 35 U.S.C. 154(b) by 45 days.

This patent is subject to a terminal disclaimer.

(21) Appl. No.: 16/911,630

(22) Filed: Jun. 25, 2020

(65) Prior Publication Data
US 2020/0411332 A1 Dec. 31, 2020

(30) Foreign Application Priority Data

Jun. 28, 2019 (JP) .............................. JP2019-121728
Jun. 28, 2019 (JP) .............................. JP2019-121729

(51) Int. Cl.
H01L 21/00 (2006.01)
H01L 21/465 (2006.01)
H01L 29/24 (2006.01)

(52) U.S. Cl.
CPC ............ *H01L 21/465* (2013.01); *H01L 29/24* (2013.01)

(58) Field of Classification Search
CPC .................................................. H01L 21/465
See application file for complete search history.

(56) References Cited

U.S. PATENT DOCUMENTS

2015/0194479 A1    7/2015 Kaneko et al.
2016/0149005 A1*   5/2016 Oda .................... C30B 25/02
                                                 252/519.1
2020/0411331 A1*  12/2020 Takahashi ............. H01L 21/465

FOREIGN PATENT DOCUMENTS

CN    104952972     *   9/2015   ......... H01L 31/1832
JP    2009-010033        1/2009
JP    2011-181784        9/2011
KR    20150142695    *  12/2015   ................ C23F 1/18

OTHER PUBLICATIONS

Kaneko, Kentaro, "Growth and Physical Properties of Corundum-Structured Gallium Oxide Alloy Thin Films", Dissertation, Kyoto Univ., Mar. 2013, pp. 1-116 with Abstract.

* cited by examiner

*Primary Examiner* — Reema Patel
(74) *Attorney, Agent, or Firm* — Wenderoth, Lind & Ponack, L.L.P.

(57) ABSTRACT

In a first aspect of a present inventive subject matter, a method of etching an object to be etched with an etching liquid that contains bromine, and the object contains at least gallium and/or aluminum.

22 Claims, 6 Drawing Sheets

METHOD OF ETCHING OBJECT

CROSS-REFERENCE TO RELATED APPLICATION

This application is a new U.S. patent application that claims priority benefit of Japanese patent applications No. 2019-121728 filed on Jun. 28, 2019 and No. 2019-121729 filed on Jun. 28, 2019, the disclosures of which are incorporated herein by reference in its entirety.

BACKGROUND OF THE INVENTION

Field of the Invention

The present disclosure relates to a method of etching an object.

Description of the Related Art

As a switching device of next generation achieving high withstand voltage, low losses and high-temperature resistance, semiconductor devices using gallium oxide ($Ga_2O_3$) with a wide band gap attract attention and are expected to be applied to power semiconductor devices including an inverter, and also, due to the wide band gap, are expected to be applied to light-emitting and/or receiving devices. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5$ to $2.5$) and can be viewed as the same material system containing gallium oxide.

However, there is a problem that gallium oxide is difficult to be etched even if an etching liquid such as hydrogen fluoride (HF) is used. A technique, in which an etching process is performed by spraying a liquid material on an object such as a substrate, a semiconductor film, or an insulation film, for example, is known. Also, a method of performing etching treatment using atomized liquid material (mist) on an object to be etched has been tried. In recent years, in manufacturing processes of semiconductor devices and electronic equipment, since patterning even submicron order is performed, for example, coating gaps is sometimes difficult even when mist is used. Accordingly, a method for etching treatment of an object with nano-level control of etching, which is useful for manufacturing semiconductor device and electronic equipment, etc., has been awaited.

Patent Document 1 describes an etching treatment in which spraying micro-mist having an average particle size of 10 µm or less on a surface of a semiconductor wafer to perform etching for dissolving and removing existing structures on the wafer. However, the method of etching described in the Patent Document 1 is not sufficient to perform etching of gallium oxide, and thus, a suitable method of etching of gallium oxide has been awaited.

Patent Document 2 describes a mist etching device, and etching treatment is performed on an object such as zinc oxide by use of etching liquid composed of etching material of hydrochloric acid or a mixture of hydrochloric acid and nitric acid and a solvent composed of pure water. However, the etching method described in the Patent Document 2 is difficult to suitably perform etching gallium oxide, and amount of etching was little, and thus, a suitable method of etching gallium oxide has been awaited.

CITATION LIST

Patent Literature

PTL1: JP2009-010033
PTL2: JP2011-181784

Non-Patent Literature

NPL 1: Kaneko, Kentaro, "Fabrication and physical properties of corundum structured alloys based on gallium oxide", Dissertation, Kyoto Univ., March 2013.

SUMMARY OF THE INVENTION

In a first aspect of a present inventive subject matter, a method of etching includes etching an object comprising at least gallium and/or aluminum with an etching liquid comprising bromine.

According to an embodiment of the present disclosure, the object may contain gallium oxide. Also, the object may have a corundum structure. According to the present disclosure, the etching the object is done at a temperature higher than 200° C. Also, according to the present disclosure, the etching the object may be done at 400° C. or higher.

According to the present disclosure, etching the object may include forming at least one trench in the object. Also, according to the present disclosure, etching the object may include reforming a surface of the object.

In a second aspect of the present inventive subject matter, a method of etching includes etching an object with an etching liquid containing bromine at a temperature higher than 200° C.

Also, according to an embodiment of the present disclosure, the object may contain at least gallium. Furthermore, the object may contain at least gallium and aluminum. Also, the object may have a corundum structure.

In a third aspect of the present inventive subject matter, a method of etching includes etching an object containing at least gallium oxide with an etching liquid that contains bromine. According to the present disclosure, the object may further contain aluminum. Also, the object may have a corundum structure.

In a fourth aspect of the present inventive subject matter, a method of etching includes etching an object of $\alpha$-$Ga_2O_3$ with atomized droplets of an etching liquid containing hydrobromic acid.

According to the present disclosure, etching the object may include forming at least one trench in the object. Also, according to the present disclosure, etching the object may include reforming a surface of the object. According to the present disclosure, the etching the object is done at a temperature higher than 200° C. Furthermore, according to the present disclosure, the etching the object may be done at 400° C. or higher.

DETAILED DESCRIPTION OF EMBODIMENTS

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

An object of the present inventive subject matter is to provide a method of etching an object, even if the object is of gallium oxide, that is difficult to be etched, for example. The present inventors have intensively studied in order to achieve the above object, found that a method of etching an object using an etching liquid containing bromine is suitably performed even on gallium oxide that is difficult to be etched sufficiently, and also found that in a method of etching an object using an etching liquid containing hydrobromic acid, etching can be suitably performed, and such a method of etching is able to solve a conventional problem(s). Further, the present inventors, after obtaining the above finding(s), have resulted in completing the present invention by carrying out further studies.

In a first aspect of a present inventive subject matter, a method of etching includes etching an object containing at least gallium and/or aluminum with an etching liquid containing bromine. According to the present disclosure, the object contains at least one selected from gallium, aluminum, gallium oxide, and aluminum oxide. In the present disclosure, the method of etching of the present invention specifically includes etching the object at a temperature that is higher than 200° C. Since etching the object is performed with atomized droplets of an etching liquid containing bromine, it is possible to safely control the amount of etching of the object even at such a high temperature.

(Etching Liquid)

The etching liquid is not particularly limited as long as the etching liquid contains bromine and is able to etch the object. The etching liquid may further contain an inorganic material and may contain an organic material. In the present inventive subject matter, the etching liquid preferably contains bromine for etching efficiently, and more preferably contains hydrogen bromide. Also, the solvent of the etching liquid is not particularly limited, however, the solvent is preferably an inorganic solvent, further preferably a polar solvent, and most preferably water. The concentration of the etching liquid is not particularly limited, however, is preferably 5% or higher in volume ratio to the solvent of the etching liquid, and further preferably 10% or higher, and most preferably 20%. The upper limit of the concentration is not particularly limited as long as the etching liquid has a concentration able to be atomized or formed into droplets.

(Object to be Etched)

The object to be etched is not particularly limited as long as the object contains at least aluminum or/and gallium and is able to be etched with the etching liquid. The shape of the object to be etched is not particularly limited, may be any shape and effective for any shape, for example, a plate shape such as a flat plate shape or a disk shape, a film shape, a fibrous shape, a shape of rod, a cylindrical shape, a prismatic shape, a tube shape, a spiral shape, a spherical shape, and a ring shape, etc. are mentioned as examples. In the present invention, the object to be etched preferably has a film shape. In aspects of the present invention, the object to be etched preferably contains at least aluminum or/and gallium, further preferably contains an oxide containing aluminum or/and gallium, more preferably contains aluminum oxide and/or gallium oxide, and most preferably contains gallium oxide. Further, the object to be etched is preferably a crystal, more preferably has a corundum structure, a β-gallia structure, or a hexagonal structure, and most preferably has a corundum structure.

The object to be etched may be integrated with a base or the like, and in the present invention, the object preferably has a layered structure, and directly or through other layer(s) on the base. The base is not particularly limited as long as the base can support the object to be etched. Material(s) of the base is not particularly limited as long as an object of the present invention is not interfered with, and may be a known base, and may be of an organic compound or of an inorganic compound. The shape of the base is not particularly limited, may be any shape and effective for any shape, for example, a plate shape such as a flat plate shape or a disk shape, a film shape, a fibrous shape, a shape of rod, a cylindrical shape, a prismatic shape, a tube shape, a spiral shape, a spherical shape, and a ring shape, etc. are mentioned as examples, however, in the present invention, the base is preferably a substrate. The thickness of the substrate is not particularly limited in the present invention.

The substrate is not particularly limited as long as the substrate has a plate shape and can support the object to be etched. The substrate may be an insulation substrate, a semiconductor substrate, or an electrically-conductive substrate, however, preferably an insulation substrate, and also preferable an insulation substrate with a metal film formed on a surface of the insulation substrate. As the substrate, a substrate having a corundum structure or the like is a preferable example. Material(s) of the substrate is not particularly limited, and may be a known one. As the substrate having a corundum structure, a substrate having a material with a corundum structure, at least at a part of a surface of the substrate, may be used. Also, the substrate may be a base substrate containing as a major component a substrate material having a corundum structure, and more specifically, a sapphire substrate (preferably, a c-plane sapphire substrate) and an α-phase gallium oxide substrate may be mentioned as examples. The term "major component" herein means that, a substrate material having the specific crystal structure is contained in the substrate such that the atomic ratio of the substrate material having the specific crystal structure in all components contained in the substrate is preferably 50% or more, further preferably 70% or more, more preferably 90% or more, and may be 100%. A known method may be used for arranging the object on the base.

In embodiments of the present invention, the object is etched with the etching liquid. The etching is not particularly limited as long as the object is able to be etched with the etching liquid. In the present disclosure, the etching the object is preferably performed with atomized droplets of the etching liquid.

In embodiments of the present invention, generating atomized droplets preferably uses ultrasonic waves. Atomized droplets obtained by using ultrasonic waves become floating with the initial velocity that is zero, and that is preferable. Since atomized droplets that are floating are carriable as gas, the atomized droplets that are floating are significantly preferable without being blown, to avoid damage caused by the collision energy like a spray. In embodiments of the present invention, the atomized droplets are preferably atomized from the etching liquid to be floating and carriable with carrier gas.

Also, the temperature of the etching is not particularly limited, however, in embodiments of the present invention, the temperature of the etching is preferably a temperature higher than 200° C., and is more preferably 400° C. or higher.

In embodiments of the present invention, by etching, it is also possible to reduce scratch-like defect(s) on the surface of the object (e.g., α-$Ga_2O_3$, etc.). For example, etching can be easily and safely performed even at depths (amount of etching) of 50 nm to several thousand nm or more from the surface of the object.

It is possible to form trenches in the object, and also possible to form trenches penetrating a layer of the object by etching the object, according to the present inventive subject matter. According to the present disclosure, a method of manufacturing a semiconductor device includes generating atomized droplets from an etching liquid containing bromine; supplying the atomized droplets with a carrier gas to carry the atomized droplets of the etching liquid by the carrier gas onto an object; and etching the object with the atomized droplets at a temperature higher than 200° C.

According to the present disclosure, the surface smoothness of the object by the etching is improved, it is possible to expect the effect of surface modification. Incidentally, depending on the time of etching, while suppressing the occurrence of cracks, since it is also possible to increase the etching amount of the object as required, it can be used in the manufacturing method of semiconductor device.

In the present invention, carrying the atomized droplets with carrier gas is preferable. The carrier gas is not particularly limited as long as an object of the present invention is not interfered with, and thus, examples of the carrier gas may include oxygen, ozone, an inert gas such as nitrogen, argon, etc., and a reducing gas such as a hydrogen gas, a forming gas, etc. The type of carrier gas may be one or two or more, and a dilution gas (e.g., 10-fold dilution gas) at a reduced flow rate and the like may be used further as a second carrier gas. The carrier gas may be supplied from one or two or more locations. While the flow rate of the carrier gas is not particularly limited, the flow rate of the carrier gas may be in a range of 0.01 L/min to 20 L/min, and further preferably in a range of 1 L/min to 10 L/min. When a dilution gas is used, the flow rate of the dilution gas is preferably in a range of 0.001 L/min to 2 L/min, and further preferably 0.1 L/min to 1 L/min.

The reaction may be any reaction capable of etching the object to be etched with the atomized droplets, and may include a chemical reaction or may include a thermal reaction by heat. In the present invention, the etching treatment is usually performed at a temperature higher than 200° C., in the present invention, preferably 350° C. or higher, and further preferably 400° C. or higher. In the present invention, even at such a high temperature, it is possible to etch the object to be etched stably and sufficiently. The upper limit is not particularly limited as long as an object of the present invention is not interfered with, however, 1900° C. or less is preferable, and 1400° C. or less is further preferable. Also, the reaction may be conducted in any atmosphere of a vacuum, a non-oxygen atmosphere, a reducing-gas atmosphere, and an oxygen atmosphere as long as an object of the present invention is not interfered with, however, the reaction is preferably conducted under a non-oxygen atmosphere or an oxygen atmosphere, and more preferably conducted under an inert gas atmosphere. Also, the reaction may be conducted in any condition of under an atmospheric pressure, under an increased pressure, and under a reduced pressure, however, in the present invention, the reaction is preferably conducted under an atmospheric pressure. Furthermore, the amount of etching is able to be set by adjusting etching time.

The method of etching is applicable to manufacturing process(es) of various products, and preferably applicable to manufacturing process(es) of semiconductor devices. Examples of the semiconductor devices include diodes, transistors, and junction barrier Schottky diode (JBS). Other than the aforementioned semiconductor devices, for example, a digital camera, a printer, a projector, a personal computer, a CPU-mounted electronic device such as a mobile phone or the like, a vacuum cleaner, an electronic device equipped with a power unit such as an iron or the like, a motor, a drive mechanism, an electric vehicle, an electric plane, a drive electronic device such as a small electric device or a micro-electromechanical system (MEMS) and the like may be mentioned.

Hereinafter, the method of etching of the present invention will be described in more details with reference to an example of manufacturing a product (semiconductor device) by applying the method of etching to a process of the manufacturing the product (semiconductor device), however, the present invention is not limited thereto.

Figure 5:
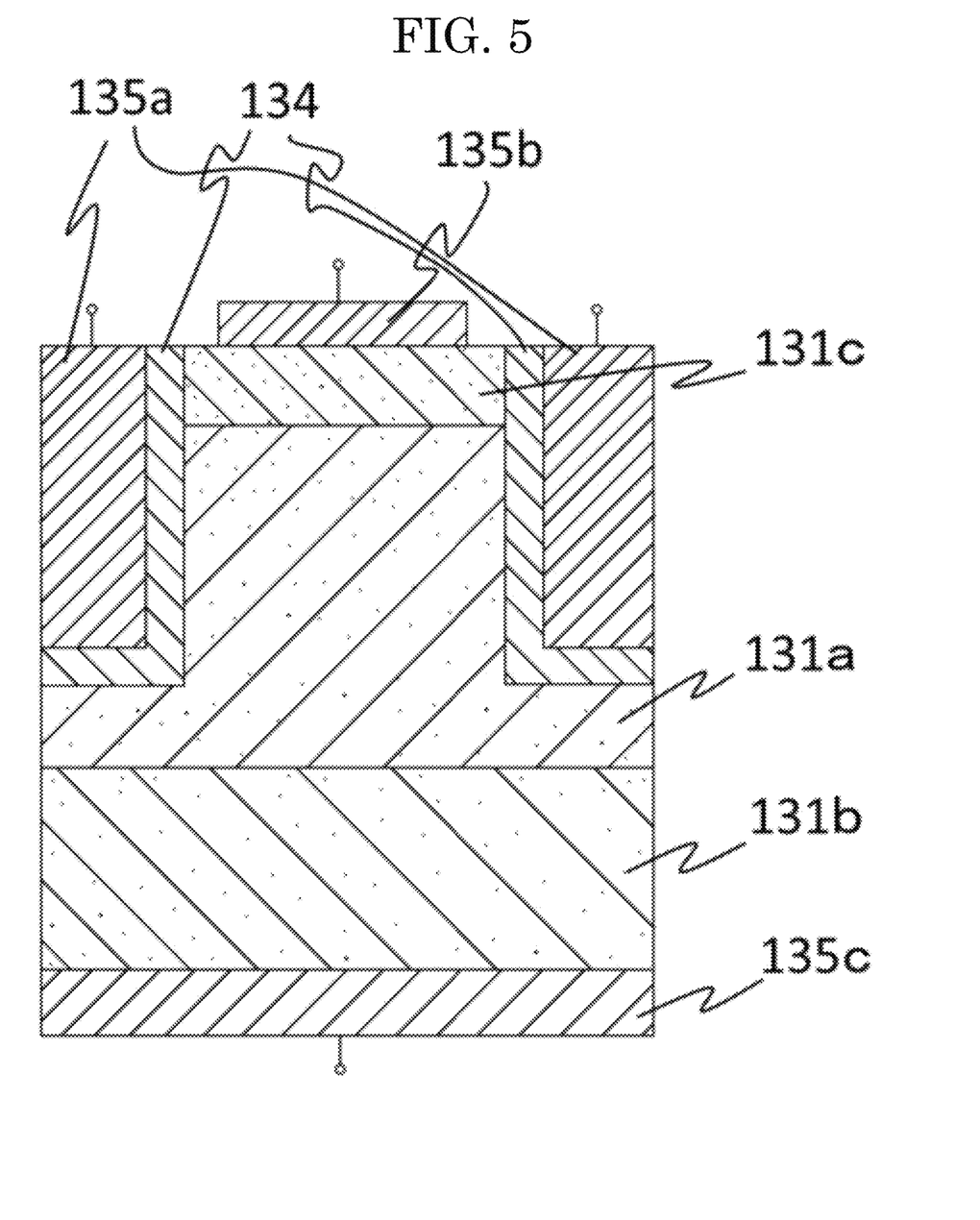
FIG. 5 is a schematic diagram illustrating a cross sectional view of a metal-oxide-semiconductor field-effect transistor (MOSFET) as an example of a manufacturing example.

FIG. 5 is a schematic diagram illustrating a cross sectional view of a metal-oxide-semiconductor field-effect transistor (MOSFET) as an example in a manufacturing example to that the method of etching of the present invention is applied. MOSFET of FIG. 5 is a trench MOSFET including an $n^-$-type semiconductor layer 131a, a first $n^+$-type semiconductor layer 131b, a second $n^+$-type semiconductor layer 131c, a gate insulation film 134, a gate electrode 135a, a source electrode 135b, and a drain electrode 135c. On the drain electrode 135c, for example, the first $n^+$-type semiconductor layer 131b that has a thickness of 100 nm to 100 μm is formed, and on the first $n^+$-type semiconductor layer 131b, for example, the $n^-$-type semiconductor layer 131a that has a thickness of 100 nm to 100 μm is formed. Also, on the $n^-$-type semiconductor layer 131a, the second $n^+$-type semiconductor layer 131c is formed, and on the second $n^+$-type semiconductor layer 131c, the source electrode 135b is formed.

In the n⁻-type semiconductor layer 131a and the second n⁺-type semiconductor layer 131c, trenches penetrating the second n⁺-type semiconductor layer 131c and reaching the middle of n⁻-type semiconductor layer 131a are formed. In each of the trenches, for example, a gate electrode 135a is buried through a gate insulation film 134 having a thickness of 10 nm to 1 μm in the trench, for example.

Figure 6:
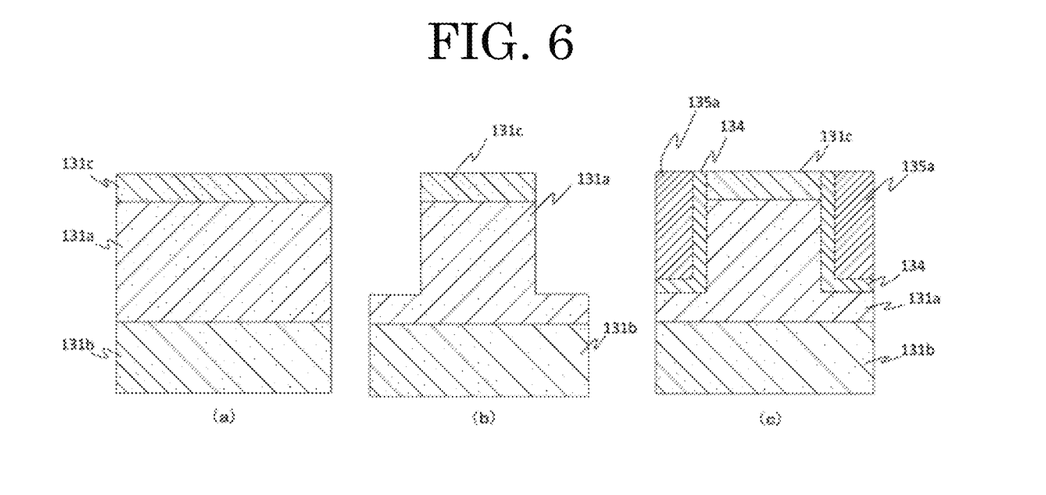
FIG. 6 is a schematic diagram illustrating a cross sectional view of a metal-oxide-semiconductor field-effect transistor (MOSFET) to explain an example of a manufacturing process.

FIG. 6 shows a part of the manufacturing process of the MOSFET shown in FIG. 5. For example, using a semiconductor structure shown in FIG. 6(a), etching is performed, by arranging a mask for etching on a predetermined region of the n⁻-type semiconductor layer 131a and the second n⁺-type semiconductor layer 131c, and etching is performed by the etching method of the present invention using the mask for etching as a mask, and as shown in FIG. 6(b), trench(es) penetrating from a surface of the second n⁺-type semiconductor layer 131c and reaching the middle of n⁻-type semiconductor layer 131a are formed. Conditions of the etching liquid and etching are described as the above. When each of the second n⁺-type semiconductor layer 131c and the n⁻-type semiconductor layer 131a contains α-$Ga_2O_3$ as a major component, devices containing α-$Ga_2O_3$ can be manufactured more industrially advantageously by etching with an etching liquid containing bromine as the etching liquid and the method of the present invention. Next, as shown in FIG. 6(c), after a gate insulation film 134 having a thickness of, for example, 50 nm to 1 μm is formed on the side surface and the bottom surface of the trench by a known method such as a thermal oxidation method, a vacuum evaporation method, a sputtering method, or a CVD method, for example, a gate electrode material 135a such as polysilicon is formed in the trench by a CVD method, a vacuum evaporation method, a sputtering method, or the like to have a thickness equal to or less than the thickness of the n⁻-type semiconductor layer.

Then, by forming the source electrode 135b on the n⁺-type semiconductor layer 131c and forming the drain electrode 135c on the n⁺-type semiconductor layer 131b using a known method such as a vacuum evaporation method, a sputtering method, or a CVD method, the power MOSFET can be manufactured. Material(s) for the source electrode and the drain electrode may be of known electrode material(s). Examples of such an electrode material include a metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy selected therefrom. Also, examples of the electrode material further include metal oxide conductive films of tin oxide, zinc oxide, indium oxide, indium tin oxide (ITO), and indium zinc oxide (IZO), organic conductive compounds, such as polyaniline, polythiophene, and polypyrrole, and mixtures selected therefrom.

Figure 7:
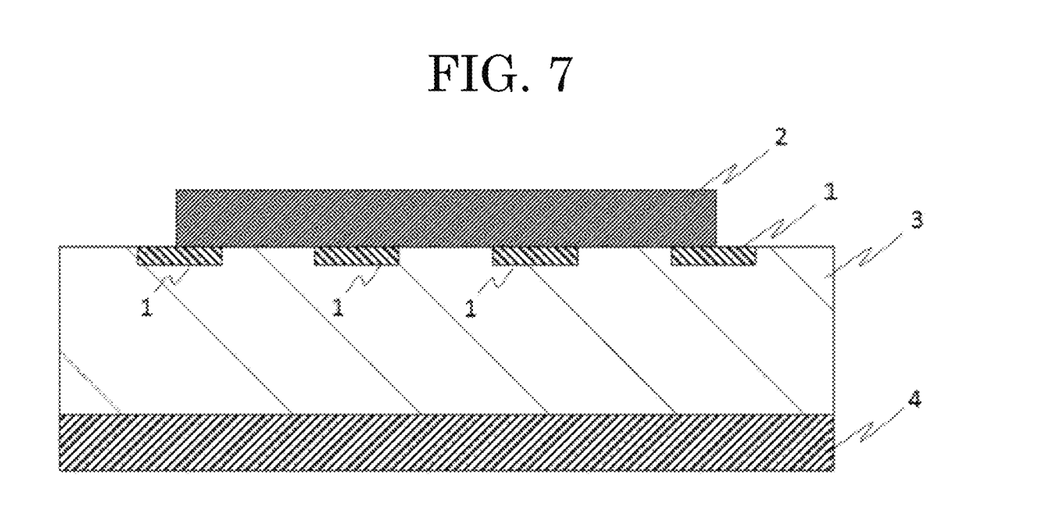
FIG. 7 is a schematic diagram illustrating a cross sectional view of a junction barrier Schottky diode (JBS) in a manufacturing example.

FIG. 7 is a schematic diagram illustrating a cross sectional view of a junction barrier Schottky diode (JBS) in a manufacturing example to which the method of etching of the present invention is applied. The semiconductor device of FIG. 7 includes an n-type semiconductor layer 3, an electrode (barrier electrode) 2 capable of forming a Schottky barrier between the n-type semiconductor layer 3 and the electrode (barrier electrode) 2, and a p-type semiconductor that is arranged between the electrode (barrier electrode) 2 and the n-type semiconductor layer 3 and capable of forming a Schottky barrier with a barrier height larger than the barrier height of the Schottky barrier of the electrode (barrier electrode) 2. The p-type semiconductor 1 is buried in the n-type semiconductor layer 3.

Figure 8:
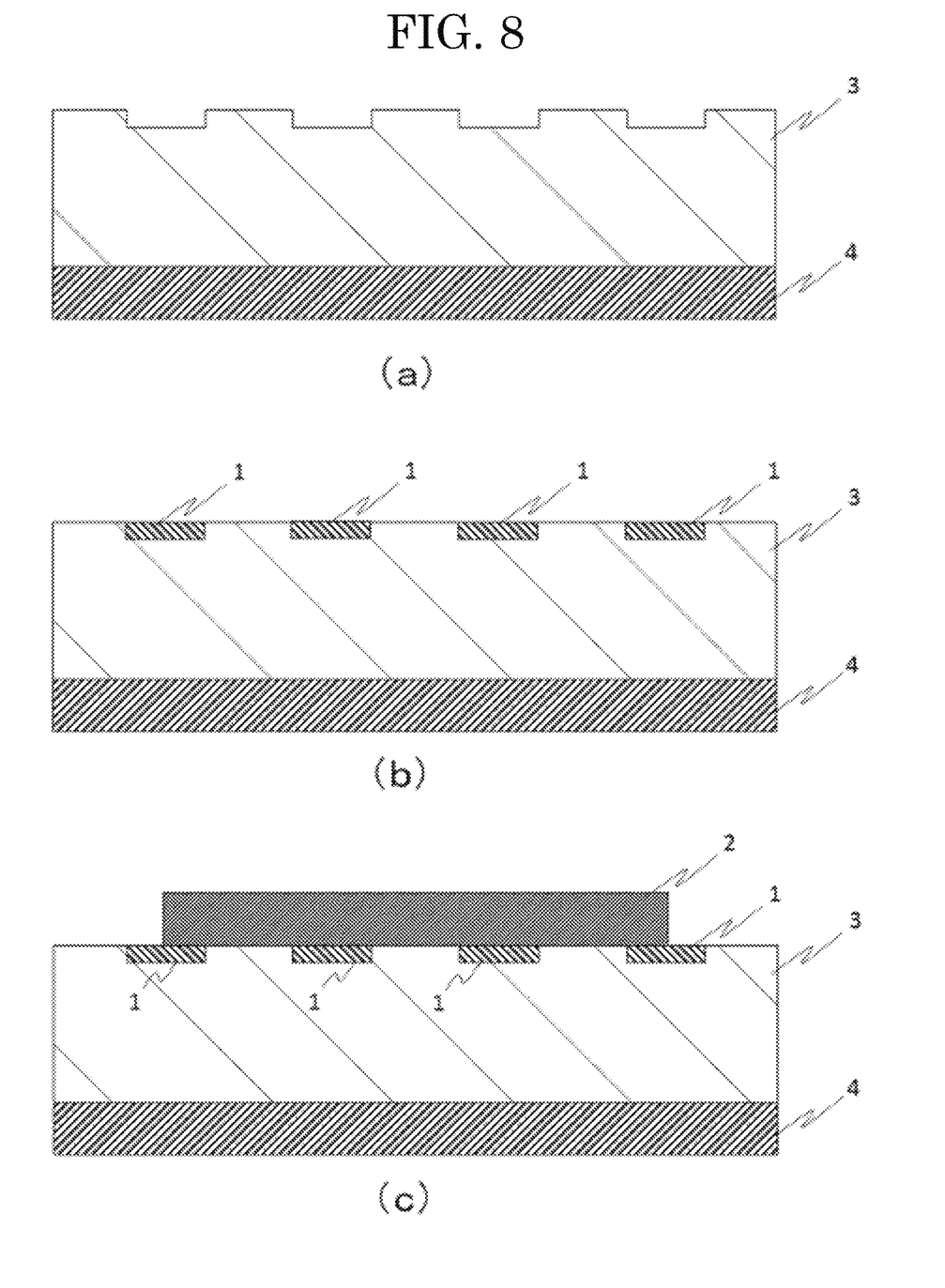
FIG. 8 is a schematic diagram illustrating a cross sectional view of a junction barrier Schottky diode (JBS) to explain an example of a manufacturing process.

Hereinafter, with reference to FIG. 8, a preferable manufacturing process of a semiconductor device is explained. FIG. 8(a) shows a layered structure including an ohmic electrode 4 arranged on a semiconductor substrate as an n-type semiconductor layer 3, trenches are formed into the n-type semiconductor layer 3 from the opposite side surface. Then, with respect to the layered structure of FIG. 8(a), using the method of etching of the present invention, after etching is given on the surface of the layered structure to form trench(es), using a photolithography method, as shown in FIG. 8(b), the p-type semiconductor 1 is formed in the trench(es) of the n-type semiconductor layer 3. After obtaining the layered structure shown in FIG. 8(b), the layered structure of FIG. 8(c) is obtained by forming the electrode (barrier electrode) 2 by the dry method (preferably a vacuum deposition method or sputtering) or the wet method or the like, on the p-type semiconductor 1 and the n-type semiconductor layer 3. The method of etching of the present invention is, in manufacturing process(es) of semiconductor device, suitably used, even as a pretreatment of each layer prior to regrowth of each layer (semiconductor layer, insulator layer, etc.) of semiconductor device.

PRACTICAL EXAMPLE

Some practical examples according to the present invention are explained as follows, however, the present invention is not limited thereto.

Practical Example 1

1. Etching Device

Figure 1:
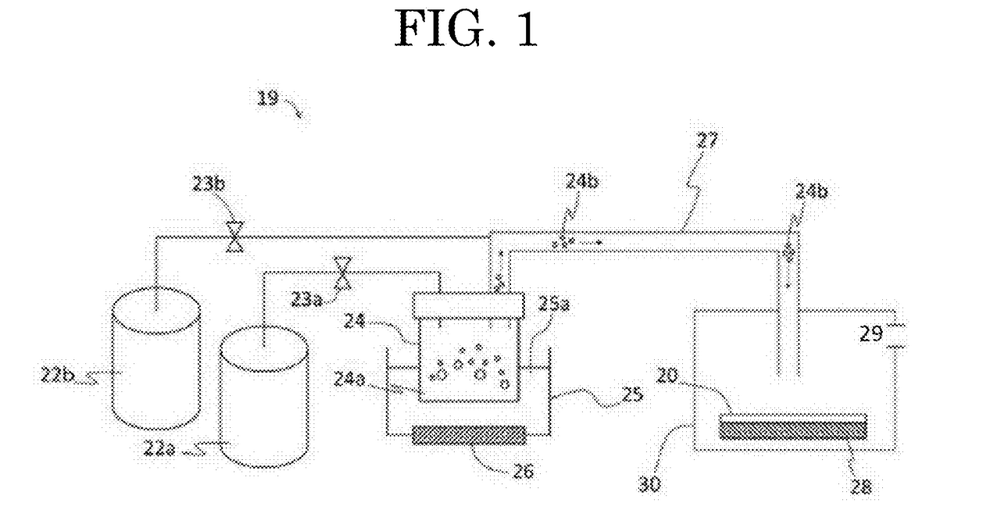
FIG. 1 shows a schematic diagram of an etching device used in Practical Examples.

With reference to FIG. 1, an etching device 19 used in the Practical Examples. The etching device 19 includes a carrier gas supply device 22a, a flow-control valve 23a to control a flow rate of carrier gas sent from the carrier gas supply device 22a, a carrier gas (dilution) supply device 22b, a flow-control valve 23b to control a flow rate of carrier gas (dilution) sent from the carrier gas (dilution) supply device 22b, a mist generator 24 in that an etching liquid 24a is contained, a container 25 in that water 25a is contained, an ultrasonic transducer 26 that is attached to a bottom surface of the container 25, an etching chamber 30 as an etching section, a supply pipe 27 that is a quartz pipe connecting the mist generator 24 and an etching chamber 30 for etching treatment, a hot plate 28 that is a heater placed in the etching chamber 30, and an object to be etched is set on the hot plate 28, and an exhaust port 29 positioned higher at a wall of the etching chamber 30 to hold the atomized droplets around the object.

2. Preparation of Etching Liquid

An etching liquid was prepared by mixing hydrobromic acid into ultrapure water such that hydrobromic acid becomes 20% in volume ratio.

3. Preparation of Etching

The etching liquid 24a obtained at the above 2, was set in a container of the mist generator 24. Next, a c-plane α-$Ga_2O_3$ film formed on a c-plane sapphire substrate was placed as an object 20 to be etched on the hot plate 28, and the hot plate 28 was activated to raise the temperature of the object up to 365° C. The flow-control valves 23a and 23b were opened and the flow rate of the carrier gas from the carrier gas source 22a was regulated at 2.0 L/min. and the diluted carrier gas from the diluted carrier gas source 22b was regulated at 2.0 L/min. In this embodiment, nitrogen was used as the carrier gas.

4. Etching Treatment

Figure 3:
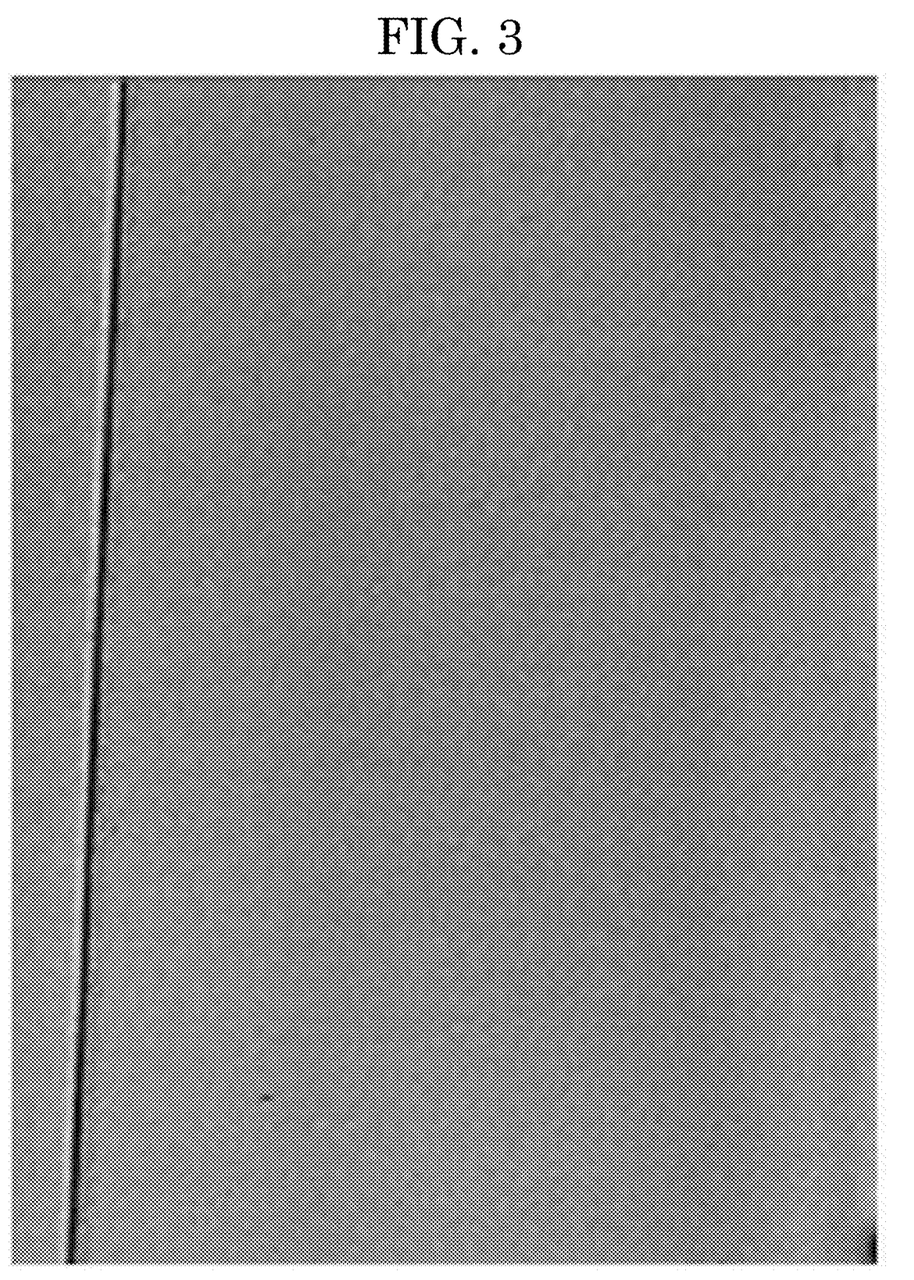
FIG. 3 shows a microscopic image after etching in a Practical Example.

The ultrasonic transducer 26 was then activated to vibrate at 2.4 MHz, and vibrations were propagated through the water 25a to the etching liquid 24a to generate mist (atomized droplets) 24b atomized from the etching liquid 24a. The mist 24b was introduced with the carrier gas through the supply pipe 27 into the etching chamber 30, reacted on the object 20 to be etched at 365° C. under atmospheric pressure, etching was given on the object 20 to be etched. Etching time was one hour. After the etching, the object was observed to confirm presence or absence of crack(s) by a microscope. FIG. 3 shows the microscopic image. As clearly shown in FIG. 3, crack(s) was not generated by etching treatment. The amount of etching was 698 nm.

Practical Example 2

Etching was given by the same conditions as the conditions of the Practical Example 1 except that the etching liquid was prepared by mixing hydrobromic acid into ultrapure water such that hydrobromic acid becomes 30% in volume ratio. The amount of etching was 1277 nm.

Comparative Example 1

Etching was given by the same conditions as the conditions of the Practical Example 1 except that the etching liquid was prepared by mixing hydrochloric acid into ultrapure water such that hydrochloric acid becomes 20% in volume ratio. The amount of etching was 12 nm.

Comparative Example 2

Etching was given by the same conditions as the conditions of the Practical Example 1 except that the etching liquid was prepared by mixing hydrochloric acid into ultrapure water such that hydrochloric acid becomes 30% in volume ratio. The amount of etching was 13 nm.

(Evaluation)

Figure 2:
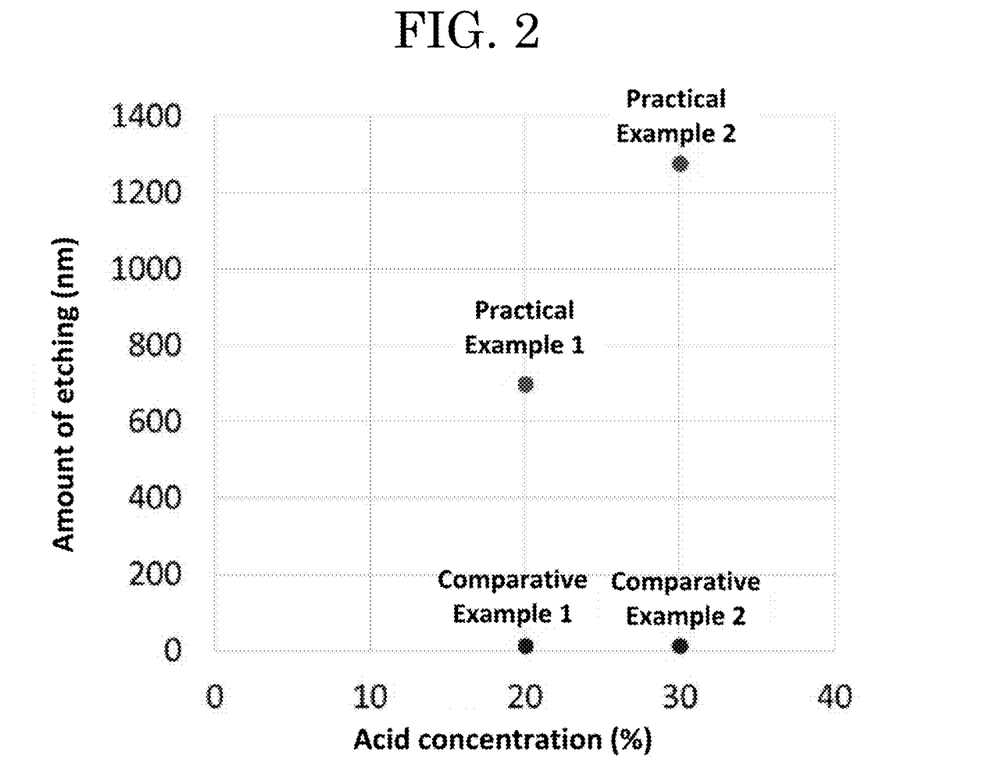
FIG. 2 shows a relationship of amount of etching and concentration of hydrobromic acid in Practical Examples and Comparative Examples.

The amount of etching in each of the Practical Examples 1 and 2 and Comparative Examples 1 and 2 was measured, and FIG. 2 shows the results.

Practical Example 3

Etching was given by the same conditions as the conditions of the Practical Example 2 except that the temperature of etching was 400° C. The amount of etching was 1473 nm, and etching appearance was favorable. Same as the Practical Example 1, the object was observed to confirm presence or absence of crack(s) by a microscope, and crack(s) was not generated by etching.

Practical Example 4

Etching was given by the same conditions as the conditions of the Practical Example 1 except that an r-plane α-$Ga_2O_3$ film formed on an r-plane sapphire substrate was used as the object to be etched. The amount of etching was 313 nm. Surface roughness (Ra) before and after the etching of the object was examined by an atomic force microscopy (AFM) observation and the surface state of the object was evaluated. As the result, the surface roughness (Ra) before the etching was 35.9 nm, whereas the surface roughness (Ra) after the etching was 28.4 nm. From this, it can be found that the surface smoothness was improved by the etching.

Practical Example 5

Figure 4:
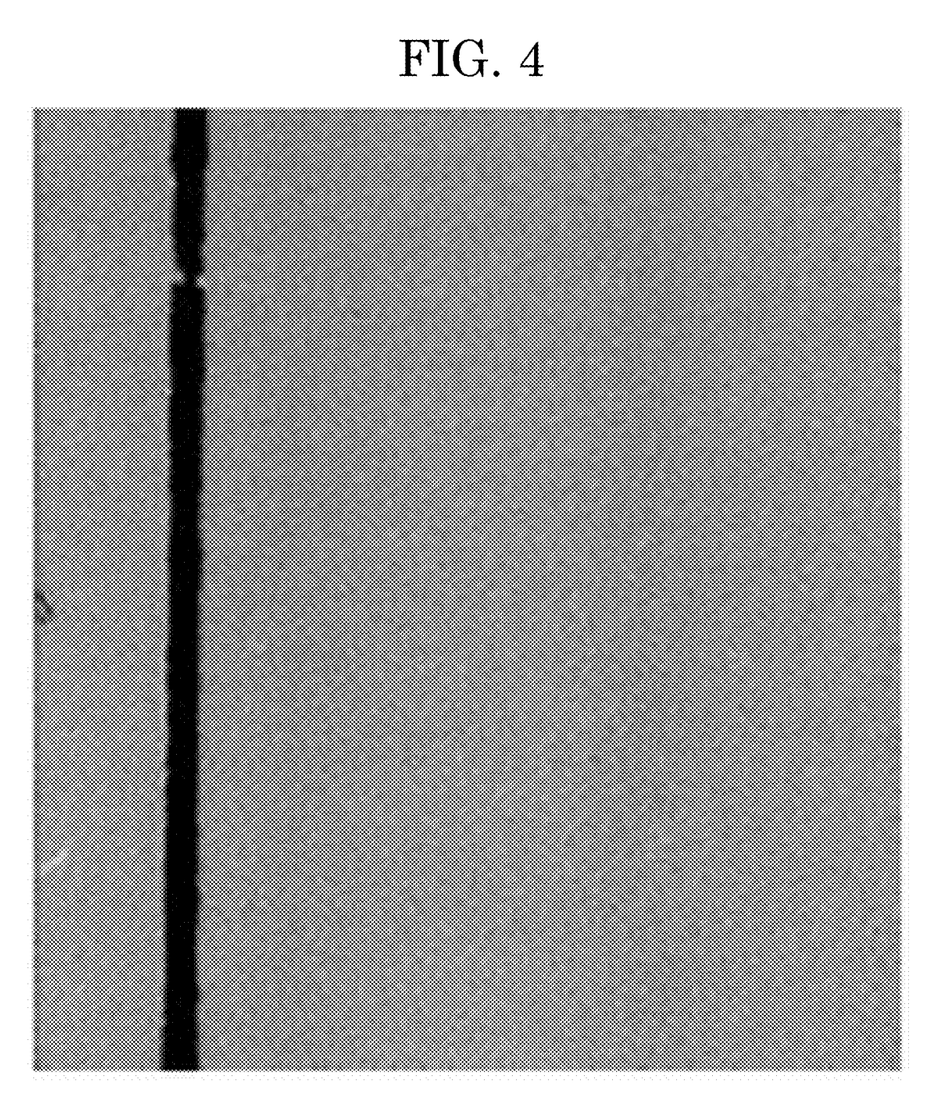
FIG. 4 shows a microscopic image after etching in a Practical Example.

Etching was given by the same conditions as the conditions of the Practical Example 4 except that the temperature of etching was 400° C. The amount of etching was 380 nm. Same as the Practical Example 1, after the etching, the object was observed to confirm presence or absence of crack(s) by a microscope. FIG. 4 shows the microscopic image. As clearly shown in FIG. 4, crack(s) was not generated by the etching. Also, the amount of etching was greater than the amount of etching in the Practical Example 3.

Practical Example 6

Etching was given by the same conditions as the conditions of the Practical Example 5 except that the etching liquid was prepared by mixing hydrobromic acid into ultrapure water such that hydrobromic acid becomes 30% in volume ratio. The amount of etching was 897 nm, and etching appearance was favorable.

Practical Example 7

Etching was given by the same conditions as the conditions of the Practical Example 1 except that an m-plane α-$Ga_2O_3$ film formed on an m-plane sapphire substrate was used as the object to be etched. The amount of etching was 223 nm. Same as the Practical Example 1, after the etching, the object was observed to confirm presence or absence of crack(s) by a microscope, and found that crack(s) was not generated by etching.

Practical Example 8

Etching was given by the same conditions as the conditions of the Practical Example 2 except that the temperature of etching was 400° C. and an m-plane α-$Ga_2O_3$ film formed on an m-plane sapphire substrate was used as the object to be etched. The amount of etching was 696 nm and the etching appearance was favorable. Same as the Practical Example 1, after the etching, the object was observed to confirm presence or absence of crack(s) by a microscope, and found that crack(s) was not generated by etching.

Practical Example 9

Etching was given by the same conditions as the conditions of the Practical Example 2 except that the temperature of etching was 400° C. and an a-plane α-$Ga_2O_3$ film formed on an a-plane sapphire substrate was used as the object to be etched. The amount of etching was 305 nm and the etching appearance was favorable.

Comparative Example 3

Etching was given by the same conditions as the conditions of the Comparative Example 1 except that an m-plane α-$Ga_2O_3$ film formed on an m-plane sapphire substrate was used as the object to be etched. The amount of etching was 0 nm.

Comparative Example 4

Etching was given by the same conditions as the conditions of the Comparative Example 2 except that an m-plane α-Ga$_2$O$_3$ film formed on an m-plane sapphire substrate was used as the object to be etched. The amount of etching was 0 nm.

Comparative Example 5

Etching was given by the same conditions as the conditions of the Comparative Example 1 except that an r-plane α-Ga$_2$O$_3$ film formed on an r-plane sapphire substrate was used as the object to be etched. The amount of etching was 0 nm.

Comparative Example 6

Etching was given by the same conditions as the conditions of the Comparative Example 2 except that an r-plane α-Ga$_2$O$_3$ film formed on an r-plane sapphire substrate was used as the object to be etched. The amount of etching was 0 nm.

Comparative Example 7

Etching was given by the same conditions as the conditions of the Comparative Example 1 except that an a-plane α-Ga$_2$O$_3$ film formed on an a-plane sapphire substrate was used as the object to be etched. The amount of etching was 0 nm.

Comparative Example 8

Etching was given by the same conditions as the conditions of the Comparative Example 2 except that an a-plane α-Ga$_2$O$_3$ film formed on an a-plane sapphire substrate was used as the object to be etched. The amount of etching was 0 nm.

(Practical Example 10) Etching was given similarly to the above by use of a potassium hydroxide solution as an etching liquid and a sapphire substrate as an object to be etched.

INDUSTRIAL APPLICABILITY

A method of etching according to the present invention is able to etch an object industriously advantageously, and thus, applicable to manufacturing process(es) of various products, and preferably applicable to manufacturing process(es) in various field of semiconductor devices and electronic devices.

REFERENCE NUMBER DESCRIPTION 1 a p-type semiconductor
2 an electrode (barrier electrode)
3 an n-type semiconductor layer
4 an ohmic electrode
19 an etching device
20 an object to be etched
22a a carrier gas supply device
22b a dilution carrier gas supply device
23a a flow-control valve of carrier gas
23b a flow-control valve of dilution carrier gas
24 a mist generator
24a an etching liquid
25 a container
25a water
26 an ultrasonic transducer
27 a supply pipe
28 a heater (hot plate)
29 an exhaust port
30 an etching chamber
131a an n$^-$-type semiconductor layer
131b a first n$^+$-type semiconductor layer
131c a second n$^+$-type semiconductor layer
132 a p-type semiconductor layer
134 a gate insulation layer
135a a gate electrode
135b a source electrode
135c a drain electrode

What is claimed is:

1. A method of etching, the method comprising:
   etching an object comprising a crystalline oxide semiconductor including at least gallium and/or aluminum with an etching liquid comprising bromine.
2. The method of etching of claim 1, wherein
   the object comprises gallium oxide.
3. The method of etching of claim 1, wherein
   the object has a corundum structure, a β-gallia structure or a hexagonal structure.
4. The method of etching of claim 1, wherein
   the etching of the object is done at a temperature that is higher than 200° C.
5. The method of etching of claim 1, wherein
   the etching of the object comprises forming at least one trench in the object.
6. The method of etching of claim 1, wherein
   the etching of the object comprises reforming a surface of the object.
7. The method of etching of claim 1, wherein
   the etching liquid is atomized droplets.
8. A method of manufacturing a semiconductor device, the method comprising:
   the method of etching according to claim 1, wherein the object is a semiconductor layer used in the semiconductor device.
9. A method of etching, the method comprising:
   etching an object with an etching liquid comprising bromine at a temperature higher than 200° C.
10. The method of etching of claim 9, wherein
    the object comprises at least gallium.
11. The method of etching of claim 9, wherein
    the object comprises gallium oxide.
12. The method of etching of claim 9, wherein
    the object comprises at least aluminum.
13. The method of etching of claim 9, wherein
    the object comprises at least aluminum and gallium.
14. The method of etching of claim 9, wherein
    the object has a corundum structure, a β-gallia structure or a hexagonal structure.
15. The method of etching of claim 9, wherein
    the temperature is 400° C. or higher.
16. The method of etching of claim 9, wherein
    the etching of the object comprises reforming a surface of the object.
17. A method of etching, the method comprising:
    etching an object comprising a crystalline oxide semiconductor including at least gallium oxide with an etching liquid comprising bromine.
18. The method of etching of claim 17, wherein
    the object further comprises aluminum.
19. The method of etching of claim 17, wherein
    the object has a corundum structure, a β-gallia structure or a hexagonal structure.

20. The method of etching of claim 17, wherein the etching of the object is done at a temperature that is higher than 200° C.

21. The method of etching of claim 20, wherein the temperature is 400° C. or higher.

22. The method of etching of claim 17, wherein the etching of the object comprises at least one trench in the object.

* * * * *